INVENTOR.
MICHEL DE BREBISSON
JEAN-CLAUDE FROUIN
BY JACQUES THIRE

AGENT

INVENTORS
MICHEL DE BREBISSON
JEAN-CLAUDE FROUIN
JACQUES THIRE
BY
AGENT

United States Patent Office 3,595,713
Patented July 27, 1971

3,595,713

METHOD OF MANUFACTURING A SEMICONDUCTOR DEVICE COMPRISING COMPLEMENTARY TRANSISTORS

Michel de Brébisson, Jean-Claude Frouin, and Jacques Thire, Caen, France, assignors to U.S. Philips Corporation, New York, N.Y.

Filed July 1, 1968, Ser. No. 741,391
Claims priority, application France, June 30, 1967, 112,632
Int. Cl. H01l 7/36, 7/44
U.S. Cl. 148—175 5 Claims

ABSTRACT OF THE DISCLOSURE

A method of making an integrated circuit containing NPN and complementary PNP transistors is described. In a preferred arrangement, a P substrate without active buried layers is covered with a first N epitaxial layer in which an N+ buried layer for the NPN transistor and a P+ buried layer for the PNP transistor is provided. Then a second N epitaxial layer is provided. The N emitter and P base are provided by diffusion over the N+ buried layer. The P emitter is provided by diffusion over the P+ buried layer, but the N base is constituted by the second epitaxial layer. The P collector is formed by the buried layer, to which a diffused contact is made. The two buried layers remain spaced from the substrate and the surface. Thus, the PNP transistor is isolated by the first epitaxial layer.

The invention relates to a method of manufacturing a semiconductor device comprising a substrate of the opposite conductivity type, on which an epitaxial surface layer composed of two adjacent layers of the one conductivity type is arranged, which composite surface layer is divided into a plurality of relatively isolated islands, in at least one of which a transistor having a base of the one conductivity type and a zone of the other conductivity type serving as a collector is arranged, said zone being diffused from a pre-diffused region provided at the interface of the said two layers of the composite surface layer.

In linear and logical integrated circuits it is very important to have a possibility of obtaining npn- and pnp-transistors by means of compatible methods. One of the greatest difficulties involved in integrated circuits resides in ensuring electrical and thermal stability. The thermal effects in npn- and pnp-transistors of the same structure are comparable with each other, it is true, but they result from opposite current directions. By connecting in opposite senses an npn- and pnp-transistor a compensation of the thermal deviations may be obtained, so that the circuit can be stabilized more easily.

In the manufacture of these transistors the isolation required by the circuitry concerned has to be considered.

A known method of manufacturing semiconductor devices comprising both pnp- and npn-transistors, so-called complementary transistors, consists in the formation of a flat, annular structure. The collector and the emitter of, for example, a pnp-transistor are diffused from the same side of a semiconductor wafer in concentrical, annular zones, the collector zone surrounding the emitter zone and these zones being separated from each other by the base zone. The base zone may be formed by a portion of the semiconductor body itself, by an epitaxial layer or by a diffused zone. Such transistors have a lateral effect not extending in the direction of depth of the semiconductor body. This solution can be carried out easily, but it provides only a very low current amplification. These annular transistors have an amplification of little more than 1 or a few units.

A further known technique described in an article in "Proceedings of the I.E.E.E." of October 1966, page 1488, provides the possibility of manufacturing in a compatible manner complementary transistors which may be integrated in the same semiconductor body and which are each arranged in an isolated island.

These transistors are arranged in epitaxial layers which are grown in order of succession on a substrate. The bases of the pnp- and npn-transistors are diffused one into the epitaxial surface layer and the other into a diffused island obtained from the interface between two epitaxial layers. With such a method it is difficult to adjust the resistivity of the bases, particularly in the second case, since the base is diffused into a zone which is obtained itself by diffusion. The breakdown voltage is comparatively low. Moreover, it is necessary to use a very thick first epitaxial layer in order to permit of isolating the diffused island forming the collector of the second transistor, since the collector has to be formed from a buried region by long diffusion in order to attain the surface of the device with the required impurity concentration. This method requires, in addition, a large number of consecutive diffusions, some of which have to extend over great depths so that the treatments take much time; moreover, the diffusion constants of given impurities are such that the thermal diffusion treatments may cause considerable disturbance of the properties of the epitaxial layers.

It is therefore important to reduce the number of diffusions and the duration or the temperature of the required thermal treatments, while the advantages of a stratified structure having one or more epitaxial layers on a substrate are maintained.

The invention has for its object inter alia to provide a method including a restricted number of treatments, particularly diffusions, for the manufacture of transistors, particularly pnp-transistors adapted to be integrated in a semiconductor device of epitaxial structure and having a high current amplification and a high breakdown voltage, while the transistor is isolated from the substrate and from the other elements of the circuit, and, as is often required, the base of the transistor and the surface layer in which it is formed are of a conductivity type opposite that of the substrate. This structure is particularly advantageous for isolating the elements from each other: the elements are arranged in islands obtained by diffusion of isolating zones extending into the substrate. The junctions formed by said islands are then polarized in the reverse direction. It is also possible to replace said isolating zones by grooves penetrating down to the substrate.

According to the present invention a method of the kind set forth is characterized in that said zone serving as a collector is provided in the form of a buried layer insulated from the substrate, while from the surface of the composite surface layer a surface zone associated with the collector is diffused down into the buried collector layer.

The method according to the invention has the advantage that the resistivity of the base of the transistor can be better adjusted so that the amplification can be acted upon more effectively than in the known method. It is possible to obtain epitaxial layers of very high crystal quality with accurately defined thickness and impurity concentrations.

The amplification is higher than that of a transistor of flat annular structure. This improvement is obtained by a minimum of additional treatments, i.e. an epitaxial growth in two stages instead of one and one additional isolation diffusion in the case of isolation by means of diffused insulating zones. Moreover, this transistor may be integrated simultaneously with other active or passive elements in the same semiconductor body.

The two epitaxial layers may have equal or different resistivities. The layer adjacent the surface may have a resistivity dependent upon the desired properties of the base to be formed therein. The resistivity of the layer adjacent the substrate may be determined in accordance with the desired properties of the zone isolating the collector from the substrate and of the parasitic transistor formed by said zone, the collector and the substrate. In many cases the optimum resistivities are such that two layers with the same impurity concentrations can be simply provided.

The surface zone associated with the collector is preferably arranged in a form in which the base of the transistor is completely surrounded by the collector formed by said surface zone and the buried collector layer.

In this way the surface of the pn-junction between the base and the collector can be minimized so that the value of the collector-base capacitance of the transistor is restricted.

The base of the transistor may be formed by a portion of the composite epitaxial surface layer adjacent the collector. In a further preferred form of the method according to the invention the base is obtained at least partly by the diffusion of a region of the one conductivity type from the surface of the composite surface layer, said region being located above the buried collector layer.

Particularly when the diffused base region extends substantially up to the buried collector layer, a transistor is thus obtained which has the advantage that the base zone has an impurity concentration with a gradient producing an electrical field which accelerates the charge carriers toward the collector. This is particularly important when the transistor is used at high frequencies.

In this manner a transistor of pnip-structure can be obtained which exhibits a satisfactory frequency characteristic curve, a high breakdown voltage and a sufficiently high punch-through voltage by maintaining a thin layer of the initial epitaxial surface layer of very high resistivity between the diffusion areas of the base and of the collector. In all cases it is advantageous to provide sufficient thickness of the insulating layer between the collector and the subjacent layer in order to eleminate substantially the effect of a parasitic transistor formed by the collector, the insulating layer and the substrate. In connection herewith the thickness of the first part of the surface layer adjacent the substrate is preferably chosen between 10 and $15\mu$.

The method according to the invention permits of providing simultaneously with the aforesaid transistors in the same semiconductor body by largely compatible treatments other active or passive devices, particularly complementary transistors, field-effect transistors and/or diodes.

Further the invention relates to semiconductor devices manufactured by the method according to the invention.

The invention will now be described more fully with reference to the accompanying drawing.

FIGS. 1*a* to 1*d* show diagrammatical sectional views of a semiconductor body in various stages of the manufacture according to the invention comprising pnp-transistors associated with an npn-transistor.

The masking layers, for example, silicon oxide layers, resultant from the various thermal treatments, are not shown. No reference is made thereto in the following description, since the application of masking layers and the provision of the required windows can be performed by methods known in the art.

In order to obtain simultaneously a pnp- and an npn-transistor by the method according to the invention as shown in FIGS. 1*a* to 1*d* for example a p-type silicon substrate 20 is used, on which an n-type epitaxial layer is deposited in two layers 22*a* and 22*b*, lying one above the other.

Prior to the application of the first n-type layer 22*a* pre-diffusion regions for the insulation regions 21*a* of the p-type conductivity are applied to the initial substrate (FIG. 1*a*) with a high surface concentration ($p^+$-type regions).

Figure 1:
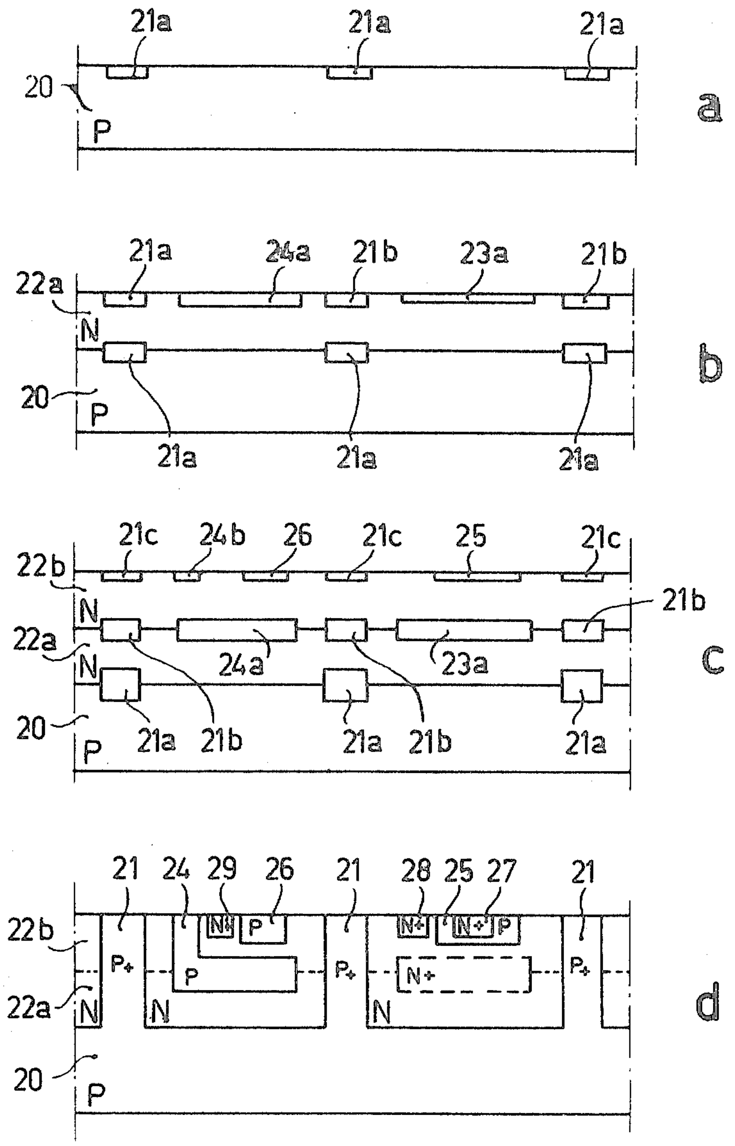

The substrate may furthermore be provided with a region 23*a* for the formation of a buried layer 23 for the collector of the npn-transistor, the concentration being such that the zone 23 has a low resistivity and a conductivity type opposite that of the substrate. The region 23*a* as is indicated in FIG. 1*b*, is preferably applied after the layer 22*a* is grown on.

Regions 21*b* for the isolation regions corresponding with the regions 21*a* are applied simultaneously with the collector 24*a* of the pnp-transistor to the epitaxial layer 22*a*.

After the application of the second epitaxial layer 22*b* which like the first layer 22*a* is of the n-type conductivity, the isolation regions 21*c* are provided, which correspond with the regions 21*b* and 21*a* and simultaneously applied with the contact zone 24*b* for the collector of the pnp-transistor, which zone is of the $p^+$-type.

Then the diffusions of the base 25 of the npn-transistor and of the emitter 26 of the pnp-transistor (p-type diffusions) are simultaneously performed and subsequently the diffusions of the emitter 27 of the npn-transistor, of the contact zone 28 of the collector of the npn-transistor and of the contact zone 29 for the base of the pnp-transistor. The last-mentioned diffusions are of the $n^+$-type with high surface concentrations.

The base of the pnp-transistor is an epitaxial base. In a different embodiment a pnp-transistor having a diffused base can be obtained. The method of manufacture is the same as that described above with the exception that an n-type diffusion is carried out from the surface of the layer 22*b* in the region located above the buried collector zone 24*a* of the npn-transistor.

The method described for the simultaneous manufacture of complementary transistors may be combined with the manufacture of other active or passive elements, particularly field-effect transistors, diodes, resistors or capacitors.

Figure 2:
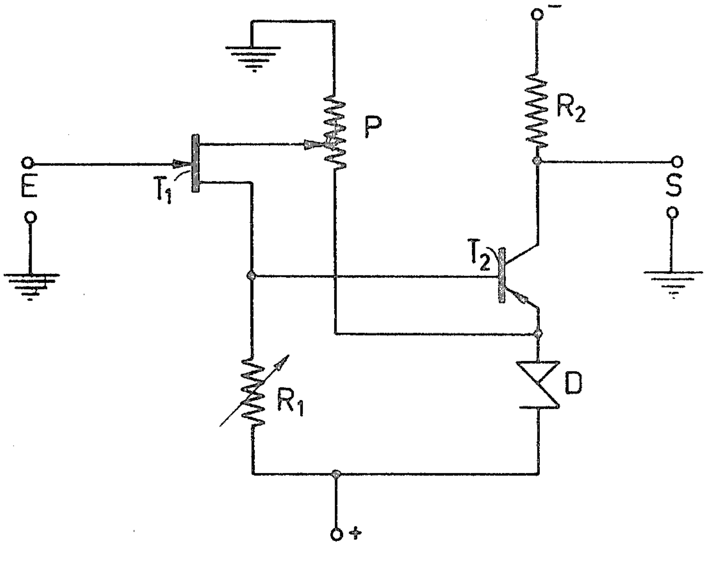
FIG. 2 is the circuit of an impedance transformer having a pnp-transistor, a field-effect transistor and a voltage-limiting diode.

The circuit arrangement shown in a diagram in FIG. 2 may comprise the various elements referred to above. It it the circuitry of an impedance transformer with drift compensation. The terminals E are the input terminals and S designates the output terminals. The field-effect transistor $T_1$, having an n-type channel, provides a high input impedance. The potentiometer P permits of adjusting the bias voltage of $T_1$ in order to compensate the drift of $T_1$ by the drift of a pnp-transistor $T_2$, while a resistor $R_1$ serves for adjusting the amplification level. The diode D polarizes the emitter of the transistor $T_2$, whose collector is connected to one of the terminals S and which has a very low dynamic impedance.

Figure 3:
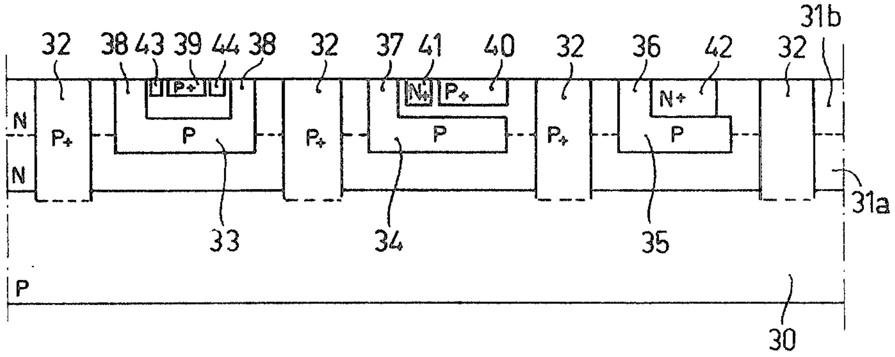
FIG. 3 shows a diagrammatical sectional view of a semiconductor body in which a group of active elements such as those of the circuit of FIG. 2 are integrated.

FIG. 3 shows diagrammatically a partial sectional view of a semiconductor body in which the active elements of the circuit of FIG. 2 i.e. a pnp-transistor, a field-effect transistor having an n-type channel and a diode having an abrupt junction are provided. The passive elements may be obtained in the same semiconductor body in known manner.

On the p-type silicon body 30 are successively deposited two epitaxial layers 31*a* and 31*b*, in whose direction of thickness three isolation regions are provided in the manner described above for obtaining the zones 32, which together with the substrate 30 surround isolated islands for each of the elements. From prediffusion regions between the two epitaxial layers the buried electrode 33 of the field-effect transistor, as well as the buried collector 34 of the pnp-transistor and the buried layer 35 forming the anode of the diode are diffused. From the surface of the layer 31*b* the contact zone 37 of the collector of the pnp-transistor, the contact zone 38 of the electrode 33 of the field-effect transistor and the contact zone 36 of the anode of the Zener diode are diffused simultaneously with the isolation regions adjacent the surface. An additional diffusion is carried out for obtaining the emitter 40 of the pnp-transistor and the region 39 of the field-effect transistor. A further diffusion provides the surface region 42 of the diode, which serves as a cathode, while finally also the contact zone 41 of the base of the pnp-transistor and the contact zones of the drain electrode 43 and of the source electrode 44 of the field-effect transistor can be diffused simultaneously.

The semiconductor body described above is given only by way of example; as a matter of course, apart from said elements or instead of them, for example, an npn-transistor, a diode having a surface layer serving as an anode instead of serving as a cathode, a field-effect transistor having a diffused p-type channel or a pnp-transistor having a diffused base can be obtained in a compatible manner as described above. The isolation zones may as an alternative be replaced by grooves or cuts. By reversing the above-mentioned conductivity types elements can be obtained which are also compatible in the same semiconductor body.

By way of example, the principal stages of the manufacture of two complementary transistors by the method according to the invention will be described hereinafter; the pnp-transistor has a diffused collector. These transistors correspond with those described with reference to FIGS. 1*a* to 1*d*.

On a monocrystalline silicon wafer of about 150$\mu$ thickness of p-type conductivity and having a resistivity of about 5 to 10 ohm cm. (20 in FIG. 1*a*) is preformed on the surface in the regions 21*a* a first boron p+-type prediffusion with a surface concentration of the impurity of $10^{19}$ to $10^{20}$ at./cc.

After the removal of the oxide layer resulting from said diffusion a first n-type epitaxial layer with an impurity concentration of about $10^{15}$ to $10^{16}$ at./cc. with a thickness of 10 to 15$\mu$ (22*a* in FIG. 1*b*) is deposited.

This first epitaxial layer is subjected to arsenic diffusion at 23*a* (n+-type) with a surface concentration of $10^{20}$ to $10^{21}$ at./cc. in order to form a buried layer which reduces the series resistance of the collector of the npn-transistor.

The same first epitaxial layer is subjected to a second boron diffusion at the areas of the regions 21*b* corresponding with the regions 21*a*, the surface concentration being the same as that of the regions 21*a*.

Simultaneously with this second diffusion the p+-type region 24*a* is diffused with a surface concentration of about $10^{19}$ to $10^{20}$ at./cc. to form the collector of the pnp-transistor.

Then the oxide layer resulting from the diffusions on the first epitaxial layer is removed, after which a second epitaxial layer of the same conductivity type and of the same concentration is deposited in a thickness of 5 to 10$\mu$ (22*b* in FIG. 1*c*).

This second epitaxial layer is subjected to a third boron diffusion at the areas 21*c* corresponding to the regions 21*a* and 21*b*. During various stages of the manufacture or during a last thermal treatment the three p+-type regions 21*a*, 21*b* and 21*c* are joined so that the isolation zones 21 are formed, which constitute the edges of the islands in which the pnp- and the npn-transistors are arranged.

Simultaneously with the third boron diffusion boron is diffused to obtain the contact zone 24*b* of the collector of the pnp-transistor also with a surface concentration of about $10^{19}$ to $10^{20}$ at./cc. The diffusion zone 24*b* is prolonged during this treatment and during the subsequent thermal treatments to a depth such that the zone 24*b* extends into the zone 24*a*, so that an uninterrupted region 24 of the p+-type is formed.

Subsequently boron is diffused in the regions 25 and 26 (FIG. 1*c*) of the p-type with a surface concentration of about $10^{18}$ to $10^{19}$ at./cc. The region 25 serves to form the base of the npn-transistor and the region 26 to form the emitter of the pnp-transistor.

Then phosphorus is diffused in the regions 27, 28, 29 (FIG. 1*a*) of the n+-type with a surface concentration of about $10^{20}$ to $10^{21}$ at./cc. The region 27 forms the emitter of the npn-transistor and the region 28 forms the contact zone of the collector of the npn-transistor and the region 29 forms the contact zone of the base of the pnp-transistor.

The device is finished by providing output contacts with the aid of, for example, vapour deposition of a metal, in vacuo, at the areas corresponding to contacts of the collector, the base and the emitter of the respective transistors. The device may furthermore be provided in a conventional manner with an envelope.

As a matter of course, the embodiments described above may be modified within the scope of the invention in various ways. The two epitaxial layers may, for example, have different dope concentrations and other known impurities may be used.

What is claimed is:

1. A method of manufacturing a semiconductor device comprising complementary transistors, comprising the steps:

(a) epitaxially growing a relatively lightly doped first epitaxial layer of one conductivity type on a substrate of the opposite conductivity type, (b) diffusing into the surface of the first epitaxial layer a relatively heavily doped buried layer of the one conductivity type and spaced therefrom a relatively heavily doped buried layer of the opposite conductivity type, (c) epitaxially growing a relatively lightly doped second epitaxial layer of the one conductivity type on the first epitaxial layer surface, (d) forming isolation zones extending through the first and second epitaxial layers to define isolated islands one of which contains the one type buried layer and another of which contains the opposite type buried layer, (e) forming in the said one island over the one-type buried layer an emitter region of said one type conductivity and a base region of said opposite type conductivity defining with a collector portion of the epitaxial layers a first transistor, (f) forming in the said other island over the opposite-type buried layer but spaced therefrom an emitter region of said opposite type conductivity forming with a base portion in the epitaxial layers and with the opposite-type buried layer as a collector a second complementary transistor, (g) and diffusing into the surface of the second epitaxial layer a zone of the opposite conductivity type spaced from the emitter and the isolation zones and extending down to the opposite-type buried layer to form a contact for the complementary transistor collector, (h) said steps being carried out under conditions such that the opposite-type buried layer does not diffuse down to the substrate but remains at all times spaced from the substrate, whereby the complementary transistor collector is isolated from the substrate by the first epitaxial layer.

2. A method as set forth in claim 1 wherein the complementary transistor contact zone of the collector is annular and surrounds the complementary transistor base.

3. A method as set forth in claim 1 wherein the isolation zones are of the opposite-type conductivity and are formed by diffusion.

4. A method as set forth in claim 1 wherein the epitaxial layers have an impurity concentration of about $10^{15}$–$10^{16}$ atoms/cc., and the thickness of the first epitaxial layer is about 10–15$\mu$.

5. A method as set forth in claim 1 wherein the steps are carried out under conditions such that the buried layers do not diffuse up to the surface but remain at all times spaced from the surface whereby the base portion of the complementary transistor is constituted by an original portion of the second epitaxial layer.

References Cited

UNITED STATES PATENTS

| | | | |
|---|---|---|---|
| 3,260,902 | 7/1966 | Porter | 148—175UX |
| 3,327,182 | 6/1967 | Kisinko | 317—235-22.1UX |
| 3,335,341 | 8/1967 | Lin | 317—235-22.1UX |
| 3,379,584 | 4/1968 | Bean et al. | 148—175 |
| 3,380,153 | 4/1968 | Husher et al. | 148—175X |
| 3,412,460 | 11/1968 | Lin | 148—175X |
| 3,421,205 | 1/1969 | Pollock | 148—175X |
| 3,450,959 | 6/1969 | Dale | 148—175X |
| 3,457,125 | 7/1969 | Kerr | 148—187 |
| 3,460,006 | 8/1969 | Strull | 148—175X |

FOREIGN PATENTS

| | | | |
|---|---|---|---|
| 1,422,157 | 11/1965 | France | 317—235-22.1 |

WINSTON A. DOUGLAS, Primary Examiner

A. SKAPARS, Assistant Examiner

U.S. Cl. X.R.

29—580; 148—187; 317—235

PO-1050
(5/69)

UNITED STATES PATENT OFFICE
CERTIFICATE OF CORRECTION

Patent No. 3595713 Dated July 27, 1971

Inventor(s) MICHEL DE BREBISSON; JEAN CLAUDE FROUIN; JACQUES THIRE

It is certified that error appears in the above-identified patent and that said Letters Patent are hereby corrected as shown below:

Col. 3, line 63, after "circuit" insert -- diagram --;

Col. 4, line 8, "insulation" should read -- isolation --;

line 51, "it" should read -- is --.

Col. 6, line 6, after "base" insert -- of the base --.

Signed and sealed this 28th day of December , 1971.

(SEAL)
Attest:

EDWARD M.FLETCHER,JR.
Attesting Officer

ROBERT GOTTSCHALK
Acting Commissioner of Patents